(12) United States Patent
Sakata

(10) Patent No.: US 6,177,862 B1
(45) Date of Patent: Jan. 23, 2001

(54) HIGH SPEED COMPARATOR

(75) Inventor: Kouji Sakata, Gifu-ken (JP)

(73) Assignee: Sanyo Electric Co., Ltd., Osaka (JP)

( * ) Notice: Under 35 U.S.C. 154(b), the term of this patent shall be extended for 0 days.

(21) Appl. No.: 09/253,768

(22) Filed: Feb. 22, 1999

(30) Foreign Application Priority Data

Feb. 24, 1998 (JP) .................................................. 10-042233

(51) Int. Cl.$^7$ ...................................................... G05B 1/00
(52) U.S. Cl. ............................................................ 340/146.2
(58) Field of Search .......................................... 340/146.2

(56) References Cited

U.S. PATENT DOCUMENTS

| 5,471,189 | * | 11/1995 | Dietz et al. | .................. | 340/146.2 |
| 5,592,142 | * | 1/1997 | Adams et al. | .................. | 340/146.2 |

* cited by examiner

*Primary Examiner*—Margaret R. Wambach
(74) *Attorney, Agent, or Firm*—Armstrong, Westerman, Hattori, McLelland & Naughton

(57) ABSTRACT

A comparator compares a first data word with a second data word. The comparator includes a first stage of two input XOR gates, each of which receive one bit of the first word and a corresponding bit of the second word, and output a coincidence detection signal. A first inverter circuit receives a control signal and generates an inverted control signal. A decision circuit receives the inverted control signal and each of the coincidence detection signals, and generates a decision circuit output signal which indicates when any one of the coincidence detection signals is active. A two input NAND gate receives the decision circuit output signal and the control signal and generates a comparator output signal. The decision circuit includes an inverter circuit that receives the inverted control signal from the first inverter circuit and a series of transistors connected between the inverter circuit output terminal and ground. The gates of the transistor receive the respective coincidence detection signals.

17 Claims, 4 Drawing Sheets

HIGH SPEED COMPARATOR

BACKGROUND OF THE INVENTION

The present invention generally relates to a comparator, and, more particularly, to speed improvements in a bit data comparator.

Comparators have many uses in electronic devices. For example, in order to check an access address to a memory device, a comparator for comparing two address data signals is used. In general, the comparator includes XOR circuits and a logic circuit connected to the XOR circuits. Each XOR circuit detects the coincidence of each data bit. When the two bits coincide, a signal having a logical value of "0" (L level) is output, and when the two bits do not coincide, a signal having a logical value of "1" (H level) is output. The logic circuit receives the output signals from the XOR circuits and determines the coincidence of the two address signals based on whether the logical value of each signal is 0. The logic circuit may be, for example, an n-input NAND circuit.

The n-input NAND circuit includes a number n of pMOS transistors connected in parallel to a power supply and a number n of nMOS transistors connected in series between the pMOS transistors and ground. The output signal of the NAND circuit is obtained from the node between the pMOS transistors and the uppermost stage nMOS transistor. However, since the nMOS transistors are connected in series, the next stage nMOS transistor turns on only when the nMOS transistor near the power supply turns on. Accordingly, the operating speed of the NAND circuit is quite slow.

FIG. 1 is a block diagram of a conventional comparator 10. The comparator 10 compares two 12-bit data words A11 to A0 and B11 to B0. The comparator 10 includes twelve XOR circuits 11A to 11L (only eight XOR circuits are illustrated), three 4-input NOR circuits 12A to 12C (only two NOR circuits are illustrated), one 4-input NAND circuit 13, and an inverter 14.

The XOR circuits 11A to 11L receive the data bits A0 to A11 and the data bits B0 to B11, respectively. When two compared bits coincide, a signal having the logical L level is output, and when the two bits do not coincide, a signal having the logical H level is output.

The 4-input NOR circuit 12A receives the output signals from the XOR circuits 11A to 11D. The 4-input NOR circuit 12B receives the output signals from the XOR circuits 11E to 11H. The 4-input NOR circuit 12C receives the output signals from the XOR circuits 11I to 11L. Each of the 4-input NOR circuits 12A to 12C outputs a signal having the logical L level when any one of the four input signals has the logical H level.

The 4-input NAND circuit 13 receives the output signals from the three 4-input NOR circuits 12A to 12C and outputs an output signal in accordance with a control signal CS. For example, when the control signal CS has the logical H level and all of the output signals from the 4-input NOR circuits 12A to 12C have the logical H levels, the NAND circuit 13 outputs an output signal having the logical L level and the inverter 14 outputs an output signal OUT having the logical H level. In other words, when the two data words coincide and the control signal is high, the NAND circuit 13 outputs a signal having the logical L level.

However, because the comparator 10 has a 2-stage configuration, it does not operate at a very high speed. In particular, as the number of data bits increases, the circuit configuration exceeds 2-stages, so that the operating speed becomes even slower.

Further, in principle, the NOR circuit includes n number of pMOS transistors connected in series to the power supply and n number of nMOS transistors connected in parallel between the pMOS transistors and a ground. Accordingly, as the number of the input signal increases, for example by one, an additional pMOS transistor and an additional nMOS transistor become necessary. As a result, the number of elements increases and the circuit area increases.

It is an object of the present invention to provide a comparator that is relatively fast and does not require an increased elements to compare more data bits.

SUMMARY OF THE INVENTION

In one aspect of the present invention, a comparator is provided that includes a plurality of coincidence detection circuits for comparing first bit data and second bit data and generating a plurality of detection signals that indicate a coincidence detection result for each bit. A decision circuit receives the plurality of detection signals and generates a decision signal indicating the coincidence decision results of the first and second bit data. The decision circuit includes a plurality of switching circuits that operate in parallel in response to the plurality of detection signals, respectively, to generate the decision signal.

In another aspect of the present invention, a comparator is provided that includes a plurality of coincidence detection circuits for comparing first bit data and second bit data and generating a plurality of detection signals that indicate a coincidence detection result for each bit. A first inverter circuit receives a first control signal and outputs an inverse signal of the first control signal from an output terminal thereof. A plurality of switching circuits are connected in parallel between the output terminal of the first inverter circuit and ground and receives the plurality of detection signals and generates a decision output signal.

In yet another aspect of the present invention, a comparator is provided that compares a first data word with a second data word. The comparator includes a plurality of two input XOR gates. Each of the XOR gates receives one bit of the first word and a corresponding bit of the second word and outputs a coincidence detection signal. A first inverter circuit receives a control signal and generates an inverted control signal. A decision circuit receives the inverted control signal from the first inverter circuit and receives each of the coincidence detection signals from the plurality of XOR gates, and generates a decision circuit output signal. The decision circuit includes a second inverter circuit has an input terminal connected to the output of the first inverter circuit and receives the inverted control signal, and an output terminal. The output terminal forms a first node. A plurality of transistors are connected in parallel between the first node and ground. The gates of the transistors receive the respective coincidence detection signals. A two input NAND gate receives the decision circuit output signal and the control signal and generates a comparator output signal.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
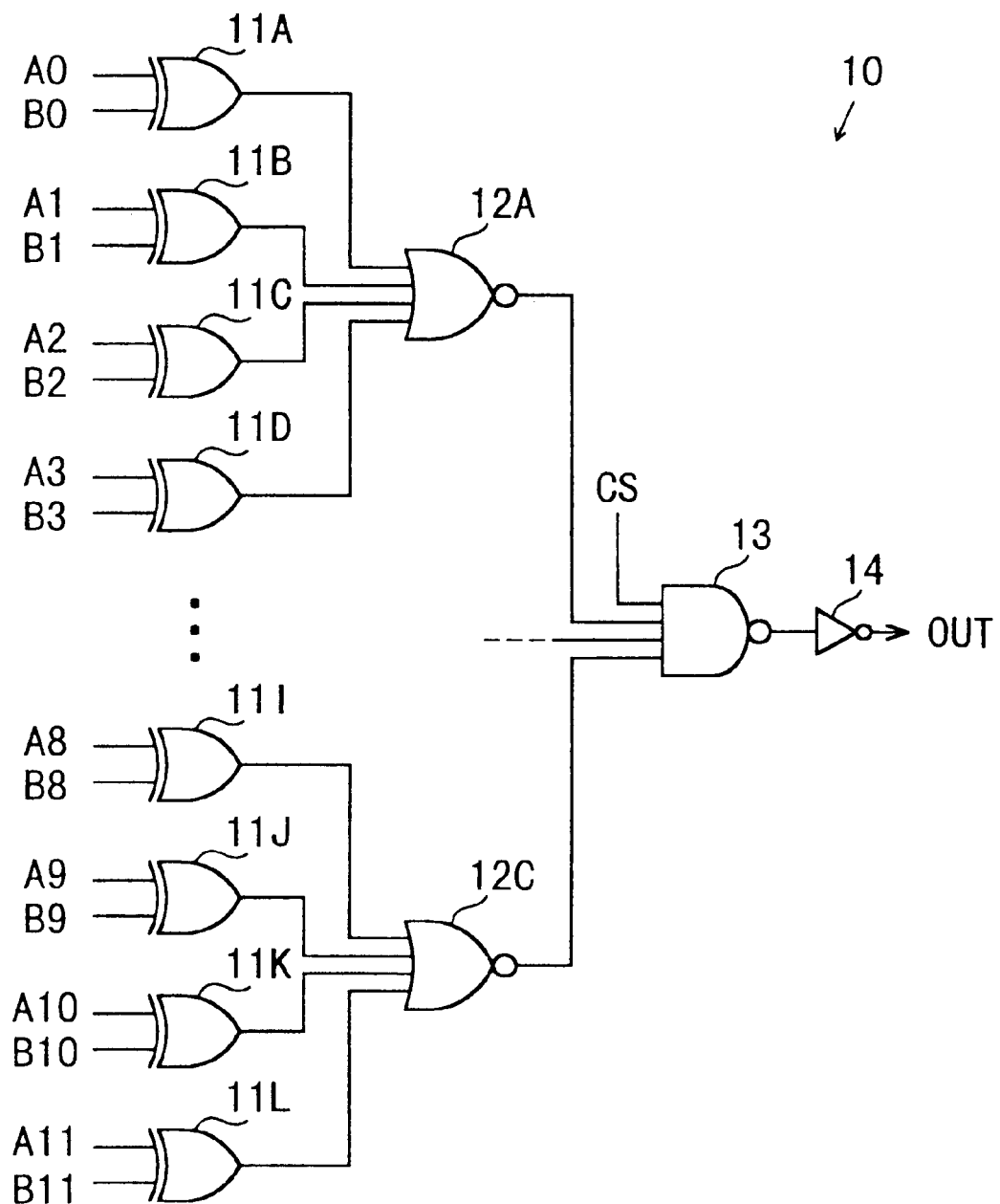
FIG. 1 is a logic circuit diagram of a conventional comparator.

In the drawings, like numerals are used for like elements throughout.

(First Embodiment)

Figure 2:
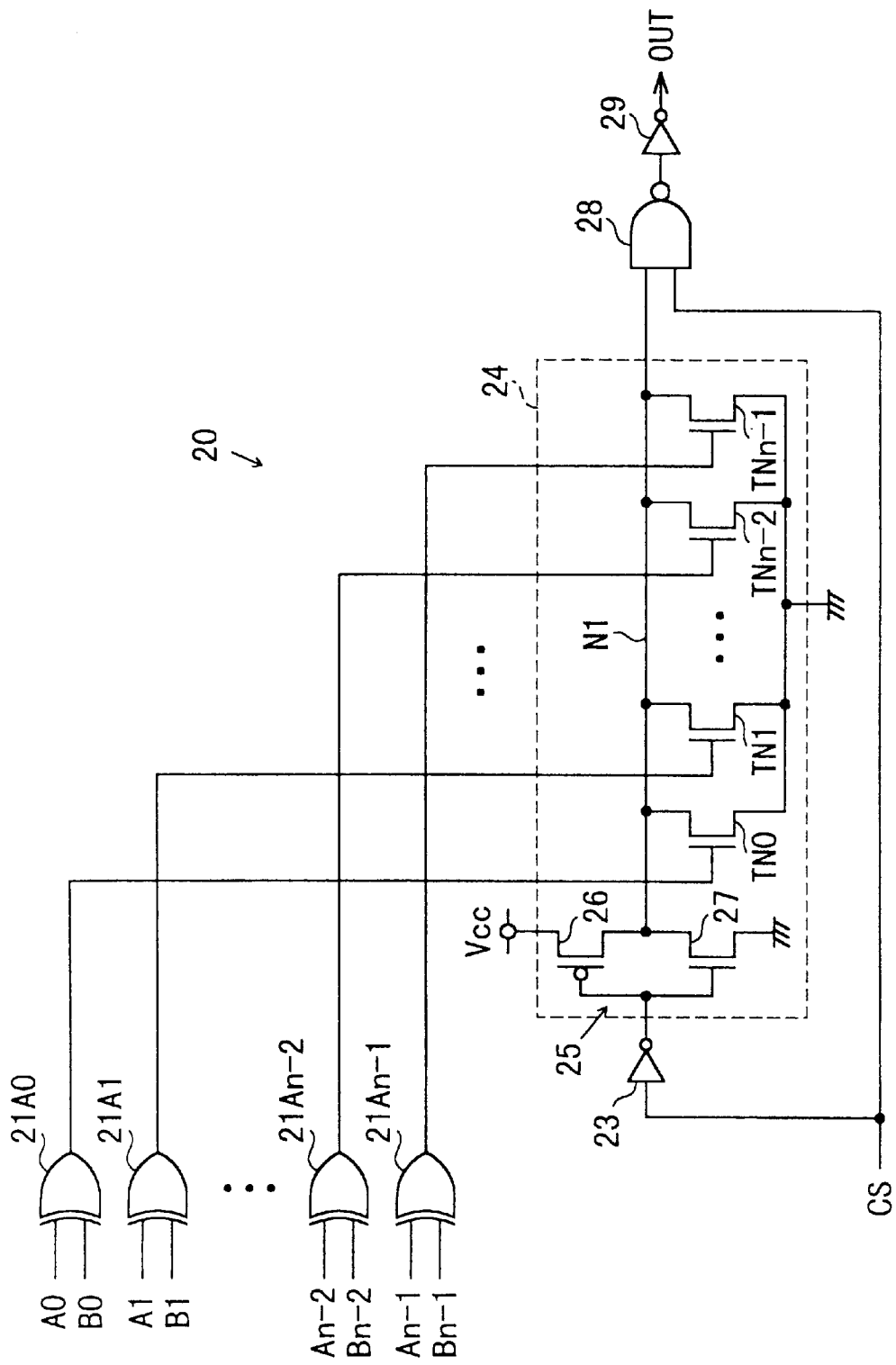
FIG. 2 is a circuit diagram of a comparator according to a first embodiment of the present invention.

FIG. 2 is a block circuit diagram of a comparator 20 according to a first embodiment of the present invention. The comparator 20 is preferably installed in a device, such as a solid-state video camera, and determines the coincidence of two digital data, such as address signals, to check the address whenever accessing a memory.

The comparator 20 compares n-bit data An-1 to A0 and n-bit data Bn-1 to B0. The comparator 20 includes a number n of XOR circuits 21A0 to 21An-1 as coincidence detection circuits (only four XOR circuits are illustrated), an inverter 23, a dynamic NOR circuit 24 as a decision circuit, a 2-input NAND circuit 28, and an output inverter 29.

The XOR circuits 21A0 to 21An-1 are preferably 2 input XOR circuits which receive bits A0 to An-1 and bits B0 to Bn-1, respectively. When the two bits compared by the XOR gate coincide, a signal having the logical L level is output. When the two bits do not coincide, a signal having the logical H level is output.

The inverter 23 receives a control signal CS (see FIG. 3) in which the logical level is alternately inverted at a predetermined cycle. The inverter 23 supplies an inverse of the control signal CS to the dynamic NOR circuit 24. For example, when the control signal CS has the logical H level, the inverter 23 supplies a signal having the logical L level to the dynamic NOR circuit 24.

The dynamic NOR circuit 24 includes an inverter 25 and a number n of nMOS transistors TN0 to TNn-1 as switching circuits. The inverter 25 has an input terminal for receiving the output signal of the inverter 23 and an output terminal (node N1) for outputting the inverse signal. Specifically, the inverter 25 includes a pMOS transistor 26 and an nMOS transistor 27 connected in series between a high potential power supply Vcc and ground. It is preferable that the pMOS transistor 26 has a large "on" resistance. The inverter 25, for example, reverses the output signal having the logical L level from the inverter 23 and outputs the inverse signal (control signal CS) having the logical H level.

The nMOS transistors TN0 to TNn-1 are connected in parallel between the node N1 and ground. The output signals from the XOR circuits 21A0 to 21An-1 are applied to the gates of the nMOS transistors TN0 to TNn-1, respectively. The respective nMOS transistors TN0 to TNn-1 turn on when the output signals of the corresponding XOR circuits 21A0 to 21An-1 have the logical H levels, and the node N1 is set to the logical L level. In other words, when any one of the output signals of the XOR circuits 21A0 to 21An-1 has the logical H level, the node N1 is set to the logical L level.

The 2-input NAND circuit 28 receives the control signal CS and the voltage signal of the node N1 (the output signal of the dynamic NOR circuit 24) and outputs the output signal in accordance with the control signal CS. An output inverter 29 is connected to the output of the NAND circuit 28 and receives the NAND circuit 28 output at its input terminal. For example, when the control signal CS has the logical H level and the output signal of the dynamic NOR circuit 24 has the logical H level, the NAND circuit 28 outputs a signal having the logical L level and the output inverter 29 outputs a output signal OUT having the logical H level. In other words, when the two data words A and B coincide, the NAND circuit 28 outputs a signal having the logical L level. As used herein, data word refers to multiple bits of data, but not to any specific word length or number of bits.

Figure 3:
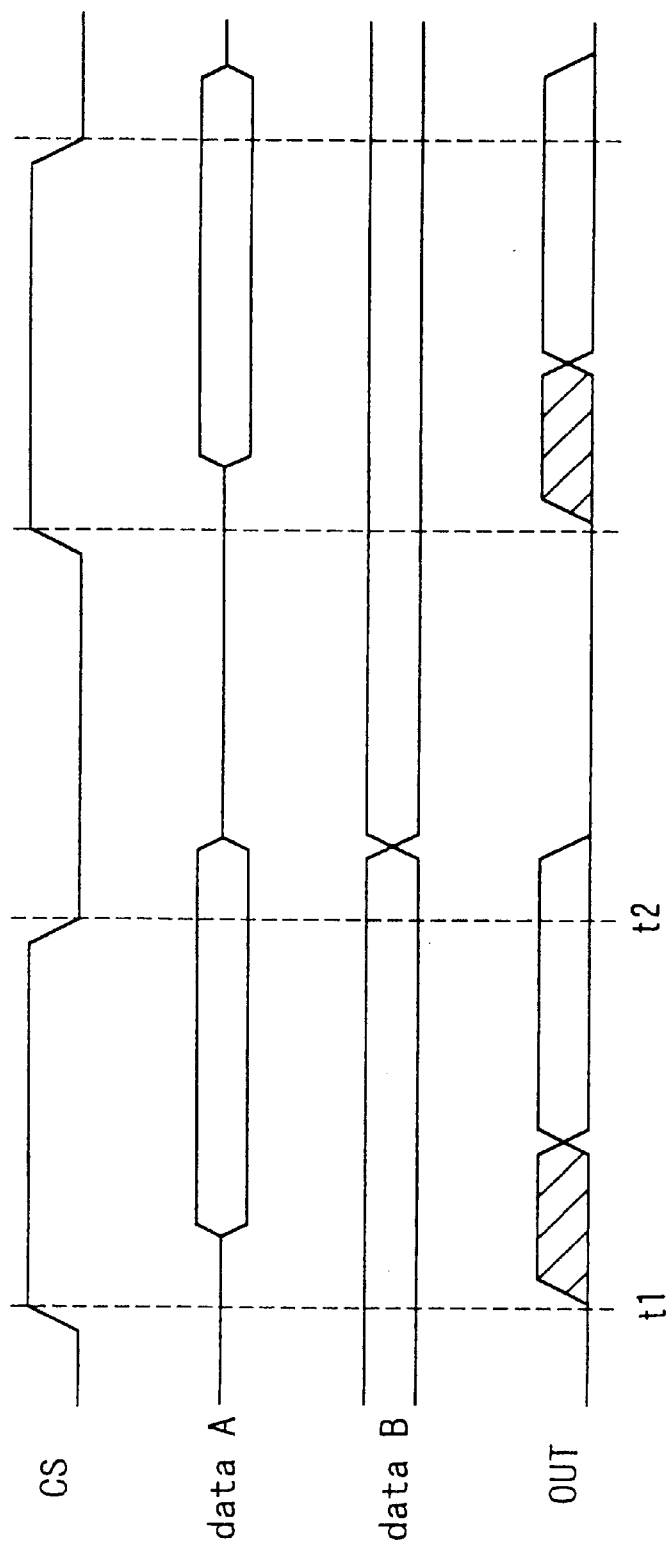
FIG. 3 is a timing chart explaining the operation of the comparator of FIG. 2.

Next, the operation of the comparator 20 will be described with reference to the timing chart of FIG. 3.

Prior to the comparison operation at time t0, the logical L level of the control signal CS is switched to the logical H level and data B is applied to the XOR circuits 21A0 to 21An-1. Hereupon, the inverter 23 supplies a signal having the logical L level to the inverter 25, and the pMOS transistor 26 of the inverter 25 turns on. At this time, since bit data A is not input, although bit data B is input, the logical levels of the output signals of the XOR circuits 21A0 to 21An-1 are indefinite. Thus, the logical level of the node N1 is indefinite. Accordingly, the logical level of the output signal OUT is indefinite as shown in FIG. 3 by oblique lines.

Subsequently, when data A is input, the respective XOR circuits 21A0 to 21An-1 determine whether the corresponding bits A0, B0, A1, B1, . . . coincide, respectively, and output decision result signals. When all of the bits of the two data words A and B coincide, all of the XOR circuits 21A0 to 21An-1 output signals having the logical L level. As a result, all of the nMOS transistors TN0 to TNn-1 of the dynamic NOR circuit 24 turn off, and the node N1 is set to the logical H level by the pMOS transistor 26 being turned on. The NAND circuit 28 receives the control signal CS and the output signal of the dynamic NOR circuit 24, in which each has the logical H level, and supplies an output signal having the logical L level to the output inverter 29. The inverter 29 then outputs an output signal OUT having the logical H level. Thus, prior to time t1, the coincidence of data A and B is determined.

Conversely, when any one bit of data A and B does not coincide, the XOR circuit that corresponds to the bit outputs an output signal having the logical H level and the other XOR circuits output signals having the logical L level. As a result, the corresponding one nMOS transistor of the dynamic NOR circuit 24 turns on in response to the XOR output signal having the logical H level. For example, when bits A0 and B0 do not coincide, the nMOS transistor TN0 turns on in response to the output signal of the XOR circuit 21A0 having the logical H level. Hereupon, the voltage of the power supply Vcc is divided by the resistance of the pMOS transistor 26 being turned on and the resistance of the nMOS transistor TN0 being turned on. At this time, since the "on" resistance of the nMOS transistor 26 is relatively large, the node N1 is set to the logical L level.

The NAND circuit 28 receives the control CS having the logical H level and the output signal of the dynamic NOR circuit 24 having the logical L level and supplies an output signal having the logical H level to the output inverter 29. Thus, the output inverter 29 outputs an output signal OUT low indicating that data A and B do not coincide.

After the logical H level of the control signal CS has been switched to the logical L level (time t1), the input of data A is stopped, and a new data B is supplied for a new comparison operation.

As described above, the comparator 20 according to the first embodiment includes the dynamic NOR circuit 24 having a number n of nMOS transistors TN0 to TNn-1 connected in parallel to the output terminal (node N1) of the inverter 25. The respective nMOS transistors TN0 to TNn-1 operate in response to the output signals of the respective XOR circuits 21A0 to 21An-1. In other words, the nMOS transistors TN0 to TNn-1 operate in parallel. Accordingly, the comparator 20 operates at high speed.

Further, when the number of comparison data bits increases, an increase in the number of elements and the circuit area are prevented because only the number of nMOS transistors of the dynamic NOR circuit 24 increases. That is, the NAND gate 28 remains a 2 input NAND gate, and thus not increase in size.

(Second Embodiment)

Figure 4:
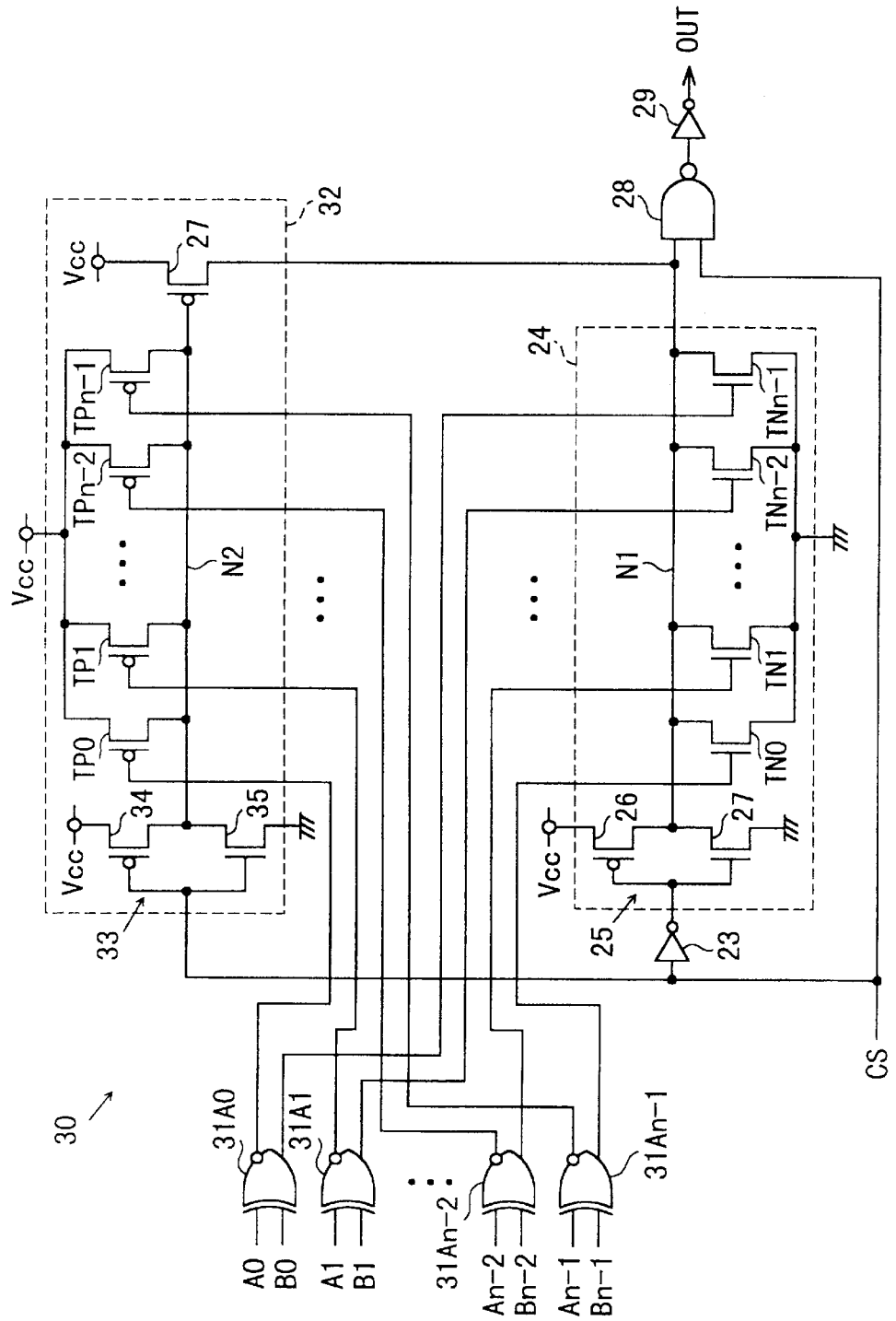
FIG. 4 is a circuit diagram of a comparator according to a second embodiment of the present invention.

FIG. 4 is a circuit diagram of a comparator 30 according to a second embodiment of the present invention. The comparator 30 includes a number n of XOR.XNOR circuits 31A0 to 31An-1 (only four are illustrated), the inverter 23, the dynamic NOR circuit 24, the 2-input NAND circuit 28, the output inverter 29, and a voltage supply circuit 32.

The XOR.XNOR circuits 31A0 to 31An-1 receive the bits A0 to An-1 and the bits B0 to Bn-1, respectively. When the two bits coincide, a signal having the logical H level is output from an XNOR output terminal (marked with a circle), and a signal having the logical L level is output from an XOR output terminal (not marked). The XOR.XNOR circuits 31A0 to 31An-1 further output a signal having the logical L level from the XNOR output terminal and output a signal having the logical H level from the XOR output terminal when the two bits do not coincide.

The voltage supply circuit 32 includes an inverter 33, pMOS transistors TP0 to TPn-1, and a pMOS transistor 37. The inverter 33 has an input terminal for receiving the control signal CS and an output terminal (node N2) for outputting an inverse signal of the control signal CS. Specifically, the inverter 33 includes a pMOS transistor 34 and an nMOS transistor 35 connected in series between a high potential power supply Vcc and ground. It is preferable that the nMOS transistor 35 has a large "on" resistance. The inverter 33, for example, inverts the control signal CS having the logical H level and outputs an inverse signal having the logical L level.

The pMOS transistors TP0 to TPn-1 are connected in parallel between the node N2 and the high potential power supply Vcc. The output signals from the respective XNOR circuits 31A0 to 31An-1 are applied to the gates of the respective pMOS transistors TP0 to TPn-1, respectively. The respective pMOS transistors TP0 to TPn-1 turn on when the output signals of the corresponding XNOR circuits 31A0 to 31An-1 have the logical L levels, and the node N2 is set to the logical H level. In other words, when any one of the output signals of the XNOR circuits 31A0 to 31An-1 has the logical L level, the node N2 is set to the logical H level.

The pMOS transistor 37 is connected between the high potential power supply Vcc and the node N1 and has a gate connected to the node N2. The pMOS transistor 37 turns on when the node N2 has the logical L level and supplies a high potential to the node N1.

Next, the operation of the comparator 30 will be described. As shown in FIG. 3, the control signal CS and data B are applied to the comparator 30 prior to data A. Thus, prior to the comparison operation, the logical L level of the control signal CS is switched to the logical H level. Hereupon, the inverter 23 supplies a signal having the logical L level to the inverter 25, and the pMOS transistor 26 of the inverter 25 turns on. At this time, since data A is not yet input, although the bit data B is input, the logical levels of the output signals of the XOR.XNOR circuits 31A0 to 31An-1 are indefinite. Accordingly, the logical levels of the node N1 and the output signal OUT are indefinite. The nMOS transistor 35 of the inverter 33 turns on in response to the control signal CS having the logical H level. Nevertheless, the logical levels of the output signals of the XOR.XNOR circuits 31A0 to 31An-1 are indefinite. Accordingly, the logical level of the node N2 is indefinite.

Subsequently, when data A is input, the respective XOR.XNOR circuits 31A0 to 31An-1 determine whether the corresponding bits A0, B0, A1, B1, . . . coincide, and output decision result signals. When all of the bits of data A and B coincide, all of the XOR.XNOR circuits 31A0 to 31An-1 output signals having the logical L level from the XOR output terminals and output signals having the logical H level from the XNOR output terminals. As a result, all of the nMOS transistors TN0 to TNn-1 of the dynamic NOR circuit 24 turn off, and the node N1 is set to the logical H level by the pMOS transistor 26 being turned on. Then, all of the pMOS transistors TP0 to TPn-1 of the voltage supply circuit 32 are set to the logical H level and the pMOS transistor 37 turns on. Thus, the voltage of the high potential power supply Vcc is supplied to the node N1 via the pMOS transistor 37 and the voltage rise of the node N1 is accelerated. The NAND circuit 28 receives the control signal CS and the output signal of the dynamic NOR circuit 24 in which each has the logical H level, and supplies the output signal having the logical L level to the output inverter 29. The inverter 29 then outputs an output signal OUT having the logical H level. Thus, the coincidence of data A and B is determined.

Conversely, when any one bit of data A and B does not coincide, a signal having the logical H level is output from the XOR output terminal of the XOR.XNOR circuit that corresponds to the noncoinciding bit, and a signal having the logical L level is output from the XNOR output terminal. As a result, the corresponding one nMOS transistor of the dynamic NOR circuit 24 turns on in response to the output signal having the logical H level, and the corresponding one pMOS transistor of the voltage supply circuit 32 turns on in response to the output signal having the logical L level. For example, when the bits A0 and B0 do not coincide, the nMOS transistor TN0 turns on in response to the output signal of the XOR.XNOR circuit 31A having the logical H level, and the pMOS transistor TP0 turns on in response to the signal from the XNOR output terminal of the XOR.XNOR circuit 31A0 having the logical L level. Hereupon, in the dynamic NOR circuit 24, the voltage of the power supply Vcc is divided by the on resistance of the pMOS transistor 26 being turned on and the on resistance of the nMOS transistor TP0 being turned on. Then, in the voltage supply circuit 32, the voltage of the power supply Vcc is divided by the on resistance of the nMOS transistor 35 being turned on and the on resistance of the pMOS transistor TP0 being turned on. At this time, since the on resistance of the nMOS transistor 35 is relatively large, the node N2 is set to the logical H level and the pMOS transistor 37 turns off.

The NAND circuit 28 receives the control signal CS having the logical H level and the output signal of the dynamic NOR circuit 24 having the logical L level and supplies an output signal having the logical H level to the output inverter 29. Thus, the output inverter 29 indicates that data A and B do not coincide and outputs the output signal OUT having the logical L level.

As described above, the comparator 30 according to the second embodiment includes the voltage supply circuit 32 that supplies the voltage of the power supply Vcc to the node N1 when data A and B coincide. Accordingly, the node N1 is quickly set to the logical H level, and the comparator 30 operates at high speed.

It should be apparent to those skilled in the art that the present invention may be embodied in many other specific forms without departing from the spirit or scope of the invention. Particularly, it should be understood that the invention may be embodied in the following forms.

The inverter 23 may be omitted. In this case, the inverse signal of the control signal CS is provided to the dynamic NOR circuit 24. The NAND circuit 28 is changed to suit the inverse signal.

The comparators 20 and 30 may be formed using FETs (field-effect transistors) instead of MOS transistors.

The data A and B may be supplied simultaneously to the comparators 20 and 30.

Therefore, the present examples and embodiments are to be considered as illustrative and not restrictive and the invention is not to be limited to the details given herein, but may be modified within the scope and equivalence of the appended claims.

What is claimed is:

1. A comparator, comprising:
    a plurality of coincidence detection circuits for comparing first bit data and second bit data and generating a plurality of detection signals that indicate a coincidence detection result for each bit; and
    a decision circuit, connected to the plurality of coincidence detection circuits, for receiving the plurality of detection signals and generating a decision signal indicating the coincidence decision results of the first and second bit data, the decision circuit including a plurality of switching circuits that operate in parallel in response to the plurality of detection signals, respectively, to generate the decision signal, wherein
    said decision circuit includes a first inverter circuit for receiving a first control signal and outputting an inverse signal of the first control signal from an output terminal thereof, and
    said comparator further comprises a second inverter circuit having an output terminal connected to an input terminal of the first inverter circuit for receiving a second control signal and supplying the first control signal that is an inverse of the second control signal to the first inverter circuit.

2. The comparator of claim 1, wherein each of the plurality of switching circuits is connected in parallel to an output terminal of the decision circuit.

3. The comparator of claim 2, wherein each of the plurality of switching circuits is an N-channel MOS transistor.

4. A comparator comprising:
    a plurality of coincidence detection circuits for comparing first bit data and second bit data and generating a plurality of detection signals that indicate a coincidence detection result for each bit; and
    a decision circuit, connected to the plurality of coincidence detection circuits, for receiving the plurality of detection signals and generating a decision signal indicating the coincidence decision results of the first and second bit data, the decision circuit including a plurality of switching circuits that operate in parallel in response to the plurality of detection signals, respectively, to generate the decision signal.

5. The comparator of claim 4, wherein the voltage supply circuit supplies the voltage to the output terminal of the decision circuit in accordance with a control signal and the operation of the second plurality of switching circuits.

6. The comparator of claim 5, wherein each of the second plurality of switching circuits is a P-channel MOS transistor.

7. A comparator, comprising:
    a plurality of coincidence detection circuits for comparing first bit data and second bit data and generating a plurality of detection signals that indicate a coincidence detection result for each bit;
    a first inverter circuit for receiving a first control signal and outputting an inverse signal of the first control signal from an output terminal thereof;
    a second inverter circuit for receiving a second control signal and outputting the first control signal that is an inverse of the second control signal from an output terminal thereof; and
    a plurality of switching circuits, connected in parallel between the output terminal of the first inverter circuit and ground, receiving the plurality of detection signals and generating a decision output signal.

8. A comparator comprising:
    a plurality of coincidence detection circuits for comparing first bit data and generating a plurality of detection signals that indicate a coincidence detection result for each bit;
    a first inverter circuit for receiving a first control signal and outputting an inverse signal of the first control signal from an output terminal thereof;
    a plurality of switching circuits, connected in parallel between the output terminal of the first inverter circuit and ground, receiving the plurality of detection signals and generating a decision output signal; and
    a gate circuit having a first input terminal for receiving the decision output signal, a second input terminal for receiving a second control signal, and an output terminal for outputting a comparator output signal.

9. A comparator comprising:
    a plurality of coincidence detection circuits for comparing first bit data and generating a plurality of detection signals that indicate a coincidence detection result for each bit;
    a first inverter circuit for receiving a first control signal and outputting an inverse signal of the first control signal from an output terminal thereof;
    a plurality of switching circuits, connected in parallel between the output terminal of the first inverter circuit and ground, receiving the plurality of detection signals and generating a decision output signal;
    a second inverter circuit, having an output terminal connected to an input terminal of the first inverter circuit, the second inverter circuit receiving a second control signal and supplying the first control signal that is an inverse of the second control signal to the first inverter circuit; and
    a gate circuit having a first input terminal for receiving the decision output signal, a second input terminal for receiving a second control signal, and an output terminal for outputting a comparator output signal.

10. The comparator of claim 9, wherein each of the plurality of the switching circuits is an N-channel MOS transistor.

11. A comparator comprising:
    a plurality of coincidence detection circuits for comparing first bit data and second bit data and generating a plurality of detection signals that indicate a coincidence detection result for each bit;

a first inverter circuit for receiving a first control signal and outputting an inverse signal of the first control signal from an output terminal thereof;

a first plurality of switching circuits, connected in parallel between the output terminal of the first inverter circuit and ground, receiving the plurality of detection signals and generating a decision output signal;

a second inverter circuit for receiving a second control signal and outputting the first control signal that is an inverse of the second control signal from an output terminal thereof; and a second plurality of switching circuits, connected in parallel between the output terminal of the second inverter circuit and a high potential power supply, for receiving the first control signal and the plurality of detection signals and generating a supply voltage.

12. The comparator of claim 11, wherein each of the second plurality of switching circuits is a P-channel MOS transistor.

13. The comparator of claim 12, further comprising a P-channel MOS transistor, connected between the high potential power supply and the output terminal of the first inverter circuit, having a gate connected to the output terminal of the second inverter circuit.

14. A comparator for comparing a first data word with a second data word, the comparator, comprising:

a plurality of two input XOR gates, each of the XOR gates receiving one bit of the first word and a corresponding bit of the second word, and outputting a coincidence detection signal;

a first inverter circuit receiving a control signal and generating an inverted control signal;

a decision circuit receiving the inverted control signal from the first inverter circuit and receiving each of the coincidence detection signals from the plurality of XOR gates, and generating a decision circuit output signal, the decision circuit including, a second inverter circuit having an input terminal connected to the output of the first inverter circuit and receiving the inverted control signal, and an output terminal, the output terminal forming a first node, and a plurality of transistors connected in parallel between the first node and ground, wherein the gates of the transistors receive the respective coincidence detection signals; and a two input NAND gate receiving the decision circuit output signal and the control signal and generating a comparator output signal.

15. The comparator of claim 14, further comprising:

a third inverter circuit connected to the NAND gate for inverting the comparator output signal.

16. The comparator of claim 14, wherein the plurality of two input XOR gates output both a coincidence detection signal and an inverted coincidence detection signal, and the comparator further comprises:

a voltage supply circuit receiving the control signal and each of the inverted coincidence detection signals, and generating a voltage supply circuit output signal which is applied to the first node.

17. The comparator of claim 16, wherein the voltage supply circuit comprises:

a fourth inverter circuit having an input terminal receiving the control signal, and an output terminal, the output terminal forming a second node; and a plurality of transistors connected in parallel between the second node and a power supply, wherein the gates of the transistors receive the respective inverted coincidence detection signals; and a transistor connected between the power supply and the first node, and wherein the gate of the transistor is connected to the second node.

* * * * *